United States Patent
Walley

(10) Patent No.: US 6,307,902 B1
(45) Date of Patent: *Oct. 23, 2001

(54) GAIN IMBALANCE COMPENSATION METHOD AND APPARATUS FOR A QUADRATURE RECEIVER

(75) Inventor: John Stuart Walley, Lake Forest, CA (US)

(73) Assignee: Conexant Systems, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/325,109

(22) Filed: Jun. 3, 1999

Related U.S. Application Data

(63) Continuation of application No. 08/568,210, filed on Dec. 6, 1995, now Pat. No. 5,930,286.

(51) Int. Cl.$^7$ .................................................. H04L 27/08
(52) U.S. Cl. ............................................. 375/345; 455/234.1
(58) Field of Search .......................... 375/130, 140, 375/136, 147, 148, 344, 345, 346, 349; 370/203, 320, 335, 441, 479, 516; 455/234.1

(56) References Cited

U.S. PATENT DOCUMENTS 3,878,468 * 4/1975 Falconer et al. .

* cited by examiner

Primary Examiner—Chi Pham
Assistant Examiner—Jean B Corrielus

(57) ABSTRACT

A cordless telephone system connectable to the public switched telephone network having a base station and one or more handsets communicating with the base station by an RF link using a time division duplex direct sequence spread spectrum quadrature modulation technique, having a gain imbalance compensation system for balancing the gain between the I and Q channels. Gain imbalance estimation is performed as part of a calibration cycle when the handset is in the cradle of the base station. The controller of the unit causes another unit to send a data signal with a frequency error. The baseband receiver performs the operation $|I|-|Q|$, which is an indication of gain error. The results are stored in an accumulator over a set period of time. The controller reads the accumulator and uses an iterative process, increasing or decreasing the gain link compensation until no gain imbalance error is obtained.

24 Claims, 6 Drawing Sheets

GAIN IMBALANCE COMPENSATION METHOD AND APPARATUS FOR A QUADRATURE RECEIVER

CROSS-REFERENCE TO RELATED APPLICATIONS

This application is a continuation of application Ser. No. 08/568,210, filed Dec. 6, 1995, now U.S. Pat. No. 5,930,286 for GAIN IMBALANCE COMPENSATION FOR A QUADRATURE RECEIVER IN A CORDLESS DIRECT SEQUENCE SPREAD SPECTRUM TELEPHONE.

BACKGROUND OF THE INVENTION

1. Field of the Invention

The present invention relates generally to improvements in digital telephones and, more particularly, pertains to new and improved gain imbalance compensation for quadrature receivers in cordless direct sequence spread spectrum telephones.

2. Description of Related Art

The cordless telephone products that exist today for the most part use analog frequency modulation in the 46–49 MHz band, and provide good speech quality when the handset is at close proximity to the base station. Although these analog cordless telephones are inexpensive and offer advantages to the customer which have made the products a successful replacement for corded telephones, these analog phones still leave much room for improvement. For example, it would be desirable to have a longer handset-to-base station range without dropouts, more channels, and greater security.

Use of digital modulation and digital coding techniques offers more robust voice communication over a radio channel, although requiring greater channel bandwidth. Digital modulation also has a capture effect that greatly surpasses co-channel and adjacent channel interference, thereby providing a more noise-free conversation. Use of digital modulation encoding also allows for the addition of effective scrambling codes to thereby greatly improve telephone security. In addition, by utilizing the industrial, medical, and scientific (ISM) band for radio transmission and reception (902–920 MHz), increased power levels above those in the 46–49-MHz band are permitted, thus increasing the operating range. A requirement for highest power in the ISM band is that direct sequence spread spectrum (DSSS) or FHSS modulation be utilized.

Gain imbalance exists on radio systems that are quadrature receivers mixed to basebands with analog techniques. Radio systems generally have gain imbalance between I and Q receiver paths due to the difficulty in matching gains in the in-phase and quadrature paths. This gain imbalance offsets the accuracy of demodulation and consequently degrades the performance of the quadrature receiver. Typical direct sequence spread spectrum systems are incapable of digitally correcting for the errors caused by the gain imbalance because of the low A/D dynamic ranges used.

SUMMARY OF THE INVENTION

The quadrature receiver of the present invention is able to estimate the imbalance error during a calibration cycle and remove the error if gain error is actually present during operation. The gain imbalance estimation is performed during a calibration cycle when the handset is parked in the cradle of the base station. A frequency error is introduced. The difference $|I|-|Q|$ is obtained from the A/D converters of the receiver as an indication of the gain error present. This gain error is measured, and the gain error compensation is increased or decreased until the desired gain balance is achieved. Gain error compensation is provided by D/A converters driving the receiver's A/D converter.

BRIEF DESCRIPTION OF THE DRAWINGS

The exact nature of this invention, as well as the objects and advantages, will become readily apparent from consideration of the following specification as illustrated in the accompanying drawings, in which like reference numerals designate like parts throughout the figures thereof, and wherein.

DETAILED DESCRIPTION OF THE PREFERRED EMBODIMENTS

The following description is provided to enable any person skilled in the art to make and use the invention and sets forth the best modes contemplated by the inventor of carrying out his invention. Various modifications, however, will remain readily apparent to those skilled in the art, since the generic principles of the present invention have been defined herein specifically to provide a gain imbalance compensation circuit for a quadrature receiver in a direct sequence spread spectrum system.

Figure 1:
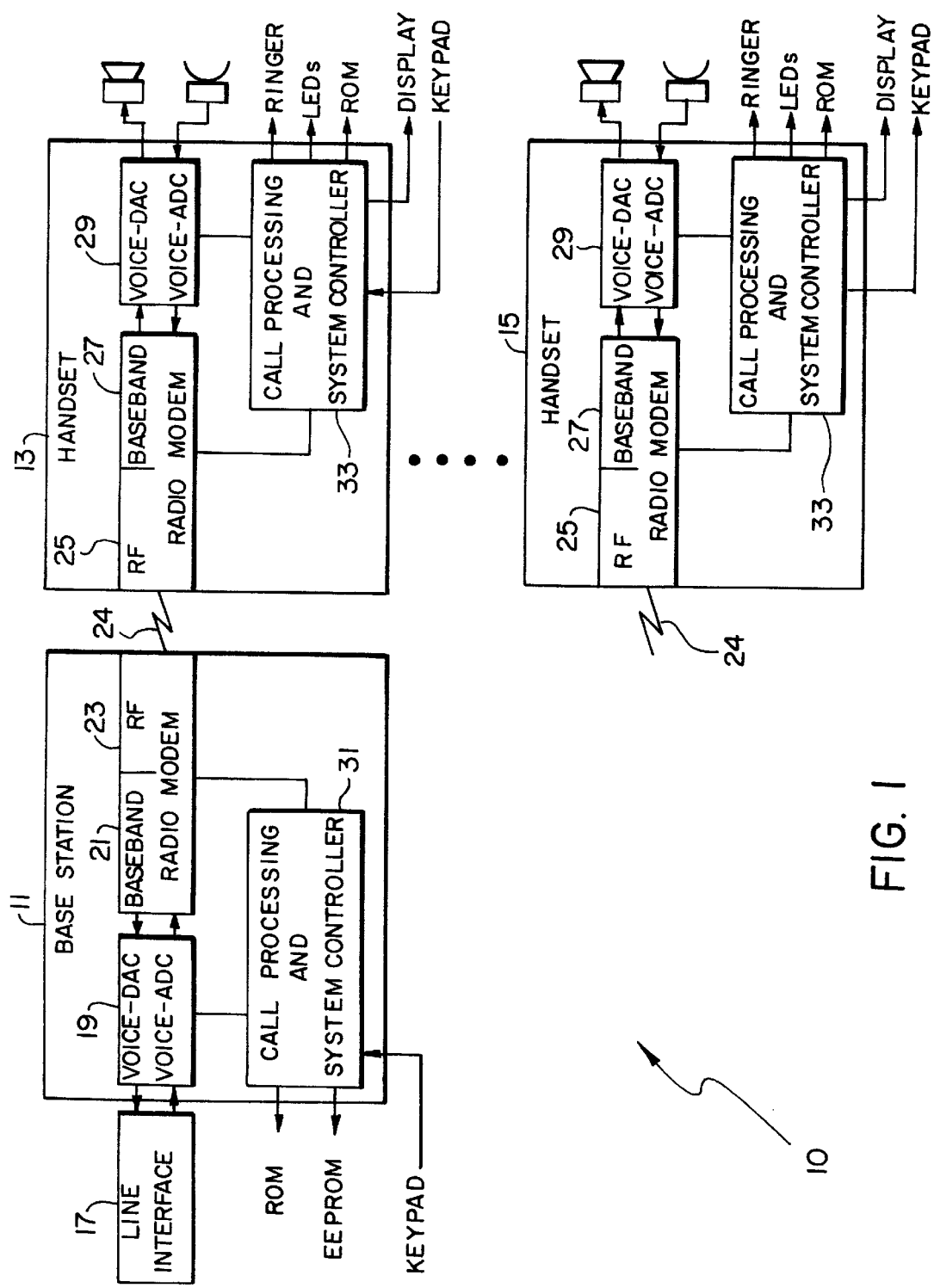
FIG. 1 is a block diagram of a time division duplex direct sequence spread spectrum telephone having more than one handset and one base station which is connected to the public switched telephone network.

Referring to FIG. 1, the digital cordless telephone 10 having a plurality of handsets 13, 15 is designed to provide full duplex voice communication between handsets 13, 15 and the public switched telephone network (PSTN) (not shown) by way of an RF channel 24 through a base station 11 which is connected to the public switched telephone network by a line interface circuit 17.

Both the base station 11 and each of the handsets 13, 15 utilize a radio modem which is composed of a baseband modem 21, 27 in the base station 11 and both handsets 13, 15, respectively, and a radio frequency modem 23, 25 in the base station 11 and both handsets 13, 15, respectively. The radio modem transfers digital voice and control data between the handsets 13, 15 and the base station 11. Voice-to-digital and digital-to-voice converters 19 in the base station 11 and the handsets 13, 15 provide voice transport over the radio modem between the speaker and microphone and the handsets and the public switched telephone network. Each of the handsets 13, 15 and the base station 11 also has system controllers 31, 33 for call processing and control functions. The system control unit 31 in the base station 11 and the controller 33 in the handsets 13, 15 function to provide the protocol for the radio modem in the base station and handsets to allow link establishment, maintenance, and power management. Telephone controls such as dial tones, ringing, keypad, and other call processing functions are also supported, as well as subsidiary functions such as displays, out-of-range alert, low battery alert, and signal quality alert.

The radio transmission and reception frequency band of the radio modem is in the lower ISM band (902–928 MHz). Operation in this band is governed by FCC Part No. 15.247 requirements and other Part 15 regulations.

Figure 2:
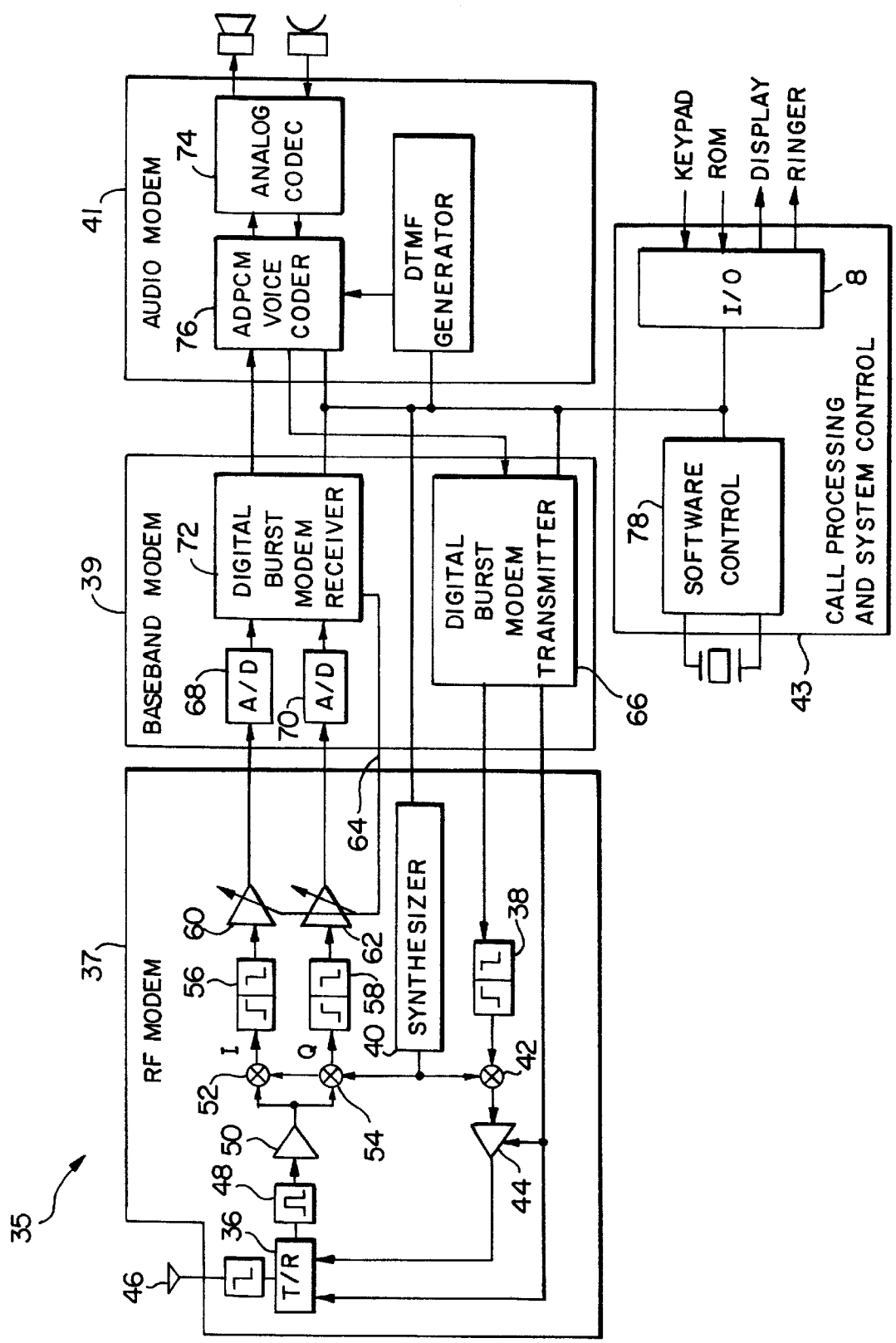
FIG. 2 is a block diagram of the modem configuration and controller found in both the handset and base station of the system of FIG. 1.

Referring now to FIG. 2, the modular construction of the base station and each handset is illustrated by the functional block diagram 35 which basically shows four functional blocks, an RF modem 37, a baseband modem 39, an audio modem 41, and a call processing and system controller 43. Each of these four functional blocks is substantially identical for each handset and each base station. The radio modem in the baseband and handsets shown in FIG. 1 are partitioned into an RF modem 37 and a baseband modem 39.

The RF modem 37 is a direct conversion transceiver. For transmit, analog, wave-shaped baseband data is modulated directly to the carrier frequency. For receive, the carrier is directly converted to analog, baseband, in-phase, and quadrature data signals. Because time division duplexing is utilized to channelize the transmit and receive data, TR switch 36 is used rather than a duplexer.

During the transmit phase, the RF modem 37 takes baseband data, high-pass filters it to remove any DC and then low-pass filters it to provide spectral shaping in filter unit 38. After filtering, the resultant signal modulates, in modulator 42, F carrier coming out of synthesizer 40. The modulated signal is then amplified to one of the two or more transmit power levels by amplifier unit 44. The signal is then routed through TR switch 36 for transmission by antenna 46.

During reception TR switch 36 selects the receive path from antenna 46. The received signal is filtered by a bandpass filter 48 to reject out-of-band signals. The filter signal is amplified by a low noise amplifier 50 and then enters a pair of mixers 52, 54, which convert the received signal to in-phase and quadrature baseband signals. Each baseband signal is high-pass and low-pass filtered, the in-phase signals in filter unit 56 and the quadrature phase signals in filter unit 58. The resultant in-phase and quadrature filtered signals are amplified in amplifiers 60, 62, respectively, by a programmable gain received from the baseband modem 49 over line 64 to bring the signals to the proper voltage levels.

The baseband modem 39 performs the spread spectrum modulation and demodulation, data timing recovery, automatic frequency control estimation and correction, and AGC estimation, framing, and rate adaptation. During transmit, the baseband transmitter assembles a voice and supervisory data B frame and a link acquisition A frame. These frames are generated by an appropriate state machine under microprocessor control in digital burst modem transmitter 66. The data bits of the selected frames are differentially encoded and modulated with a spreading code in burst modem transmitter 66. After modulation, the nonreturn to zero (NRZ) signal is sent to the RF modem 37 for transmission.

During receive, the baseband modem 39 performs A/D conversion on the in-phase and quadrature baseband signals from the RF modem by A/D converters 68, 70, respectively. The A/D converted digital outputs are phase rotated and data demodulated in digital burst modem receiver 72.

The audio modem 41 comprises a CODEC 74 and audio engine 76. The CODEC 74 converts between a continuous amplitude, continuous time audio waveform, and an 8000 sample-per-second 13-bit digital representation. The audio engine or voice coder 76 implements a CCITT G721 ADPCM voice compression algorithm which converts between 32 kbps digital RF modem channel data and 8 kbps 13-bit linear voice.

The call processing and system controller 53 consists of a 6502 microcontroller 78 with an I/O 80, which supports all the system and call processing functions.

Figure 3:
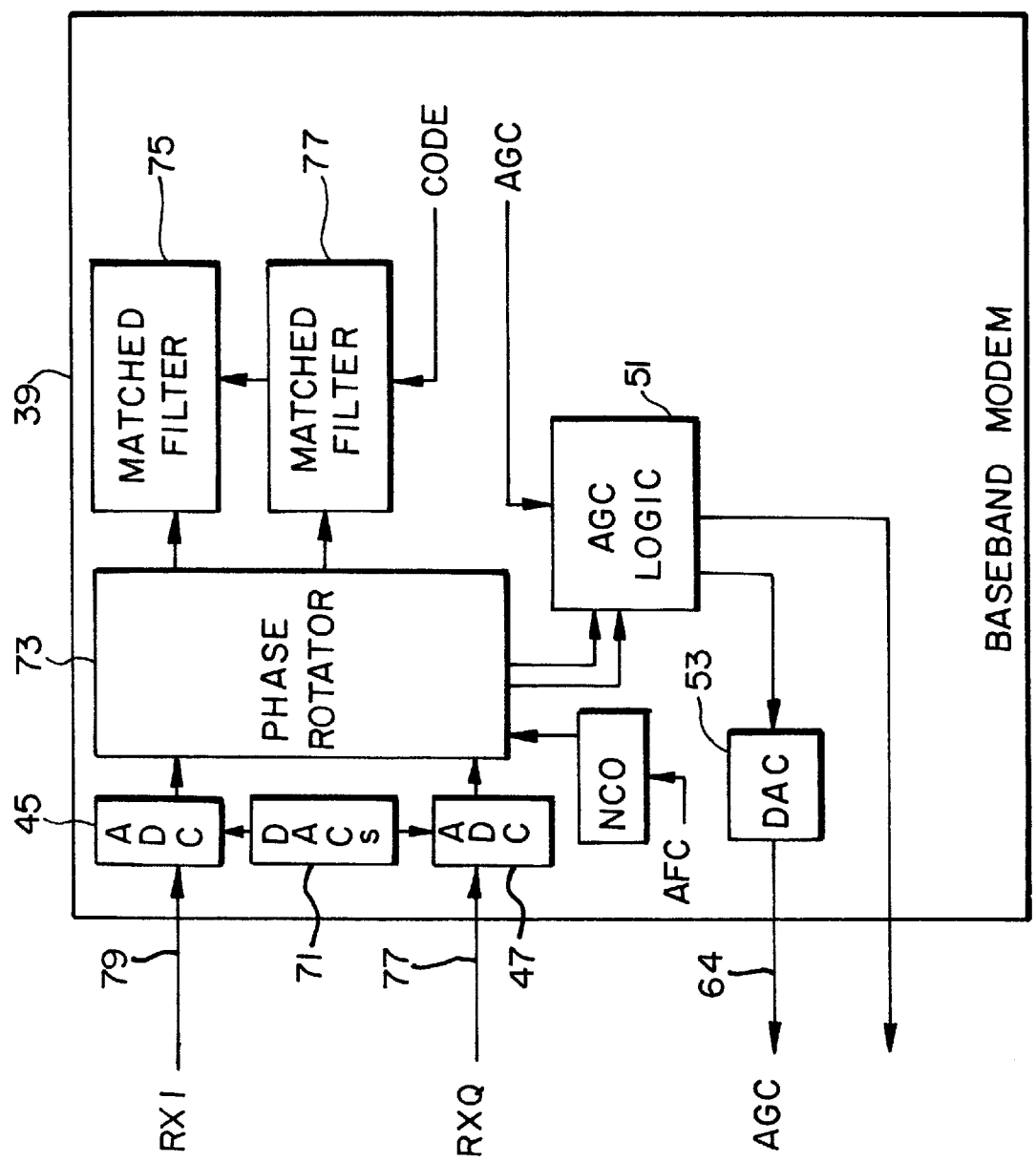
FIG. 3 is a block diagram of the receiver part of the baseband modem shown in FIG. 2.

Referring now to FIG. 3, which shows a portion of the baseband modem 39, specifically the receiver, in greater detail, the baseband modem performs all spread-spectrum modulation and demodulation, data recovery, AFC estimation and correction, AGC estimation, framing, and rate adaptation.

The receiver portion of the baseband modem 39 performs A/D conversion on the in-phase 79 and quadrature 77 baseband signals in A/D converters 45, 57, respectively. The A/D converted signals are then phase rotated in phase rotator 73 to remove frequency offsets and sent to matched filters 75, 77 for timing recovery and data demodulation. The matched filter despreads the data, removing the spread spectrum coding.

The in-phase and quadrature baseband signals which have been converted by A/D converters 45, 47 are also provided to automatic gain control logic 51, which determines the gain based on factors to be explained hereinafter, and supplies a gain control signal to digital-to-analog converter 53, the output of which is sent to the RF modem over line 64 to be used as the automatic gain control signal.

Figure 4:
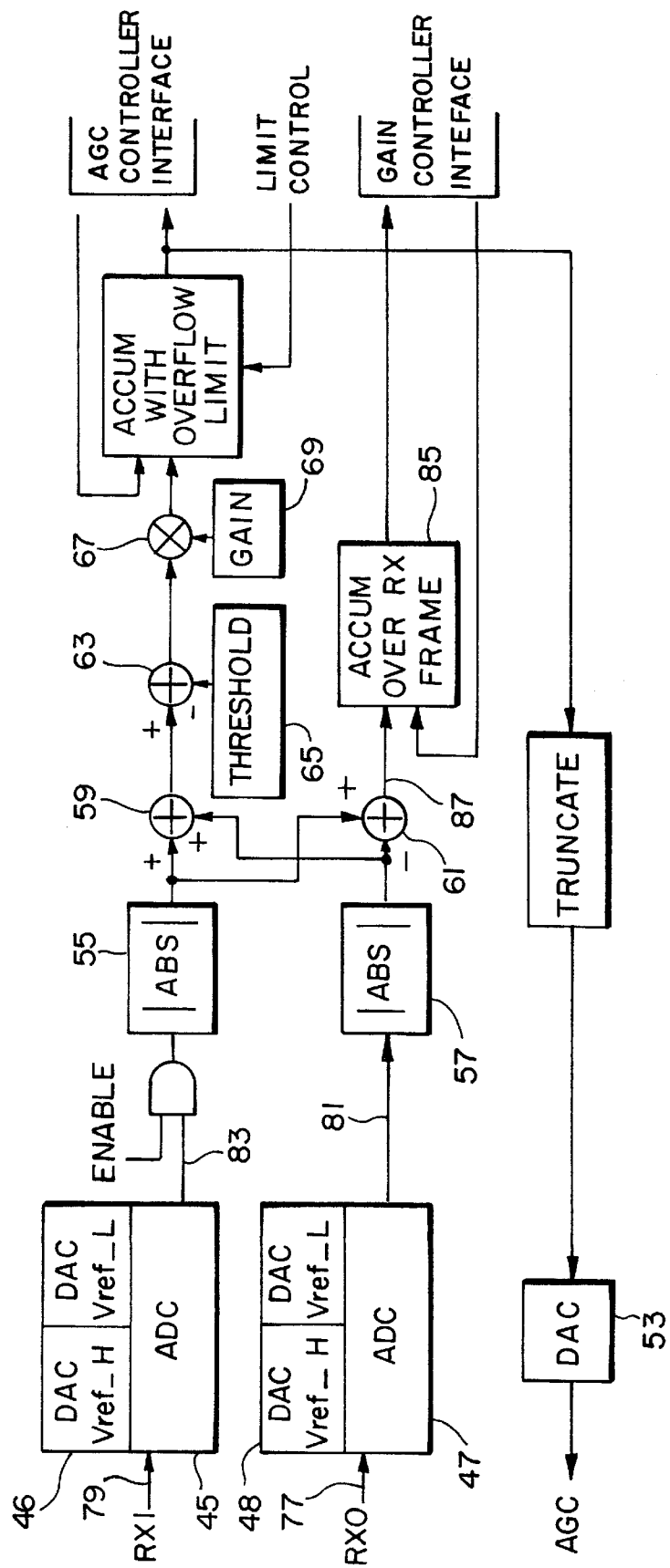
FIG. 4 is a block diagram of the automatic gain control and gain imbalance logic circuitry of FIG. 3.

Referring now to FIG. 4, which illustrates the basic functions of the AGC logic 51 of FIG. 3, it can be seen that the in-phase and quadrature phase baseband signals from the RF modem are supplied to the A/D converters 45, 47, respectively. Thereafter, the outputs are taken by the logic circuit and detected in operational units 55, 59 for the in-phase signals and 57, 61 for the quadrature phase signals, to obtain the energy approximation |I|+|Q|, which is the discriminator signal. The value of the discriminator signal is subtracted from a programmable reference stored in threshold register 65, then multiplied by a loop gain constant stored in gain register 69 by operators 63 and 67, respectively. The output of multiplier 67 is supplied to an accumulator 71, where it is integrated The most significant bits of the accumulator 71 are provided to digital-to-analog converter 53 and then sent to the RF modem for gain control.

Gain imbalance estimation and calibration is accomplished during the time that the handset is in the cradle of the base station, i.e. not in use, in standby. In order to make imbalance measurements, the baseband modem 39 must ensure that there is some system frequency error present compared to the reciprocal of the gain imbalance measurement time. In addition, the input signals I and Q must be in AGC lock and be slowly changing compared to gain imbalance measurement time. The gain imbalance is read by the controller 43 (FIG. 2) by resetting and then reading the gain imbalance accumulated in accumulator 85 over a set time interval.

The required frequency error is introduced by changing the synthesizer frequency. The logic circuit then performs the operation |I|−|IQ| on the in-phase and quadrature signals received from the A/D converters 45, 47, respectively. The result is an indication of the gain error present. This operation is performed by absolute value circuit 55 operating on the I signals received on line 83, absolute value circuit 57 operating on the Q signals received on line 81 to produce |I| and |Q|, respectively. The two absolute values are subtracted in operator 61, which receives |I| at its positive (+) input, and |Q| at its negative (−) input, producing the difference |I|−|Q| on line 87, which is supplied to the gain imbalance accumulator 85.

Calibration of the circuit to provide the correct amount of gain error compensation is accomplished by an iterative method that increases or decreases the gain error compensation until the result is achieved. The gain error compensation is provided by the simple nonlinear D/A converters 46, 48 driving the resistive ladder networks (not shown) of the receiver A/D converters 45, 47, respectively.

The I and Q baseband signals are received from the RF modem at inputs 79, 77, respectively of the A/D converters 45, 47 sampled at 1.92 MHz and converted to digital representations on output lines 83, 81, respectively. The A/D converters 46, 47 have seven uniformly-spaced thresholds, with the midthreshold going through midrise.

Each A/D converter 45, 47 is served by a D/A converter 46, 48, respectively, that controls the voltage going between thresholds. The D/A converters 46, 48 provide for adjustment of the gain imbalance between the I and Q channels 79, 77.

Figure 5:
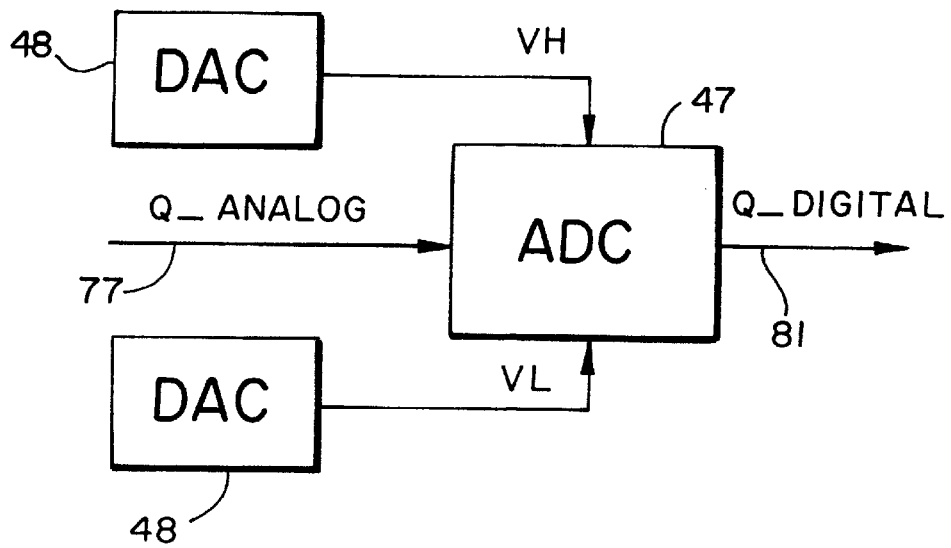
FIG. 5 is a block logic diagram of the preferred embodiment of the gain imbalance compensation circuit of the present invention for the Q leg.
Figure 6:
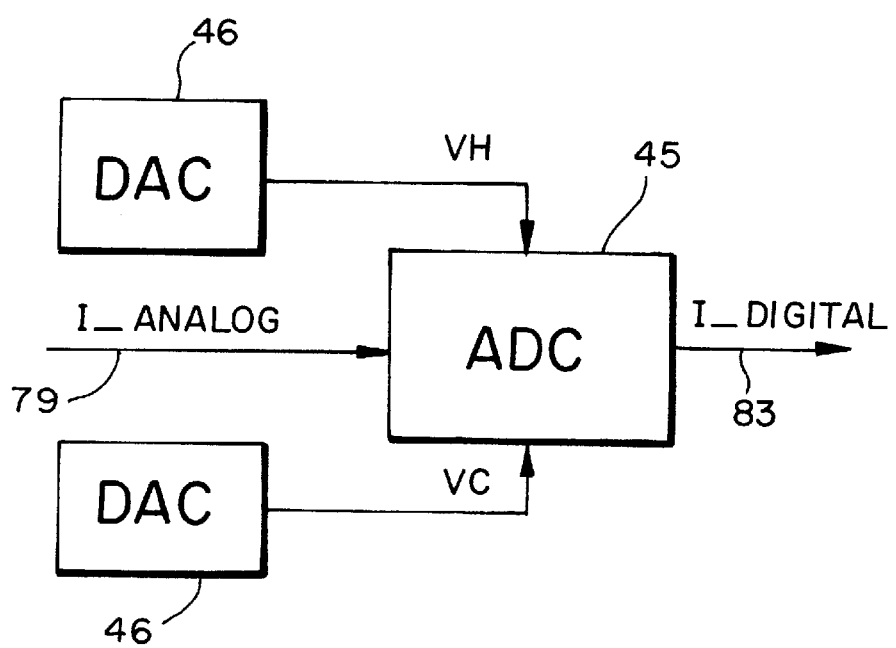
FIG. 6 is a block diagram of the preferred embodiment of the gain imbalance compensation circuit of the present invention for the I leg.

Referring now to FIGS. 5 and 6, a more detailed block diagram of the relationship between the D/A converters 46, 48 and the A/D converters 45, 43 for the I channel and Q channel, respectively, is shown. The D/A converters 48, 46 provide gain imbalance adjustments of ±6 dB with steps less than 2 dB. The output levels of the A/D converters 45, 47 are encoded to +7, +5, +3, +1, −1, −3, −5, −7 using four-bit two's complement numbers.

Figure 7:
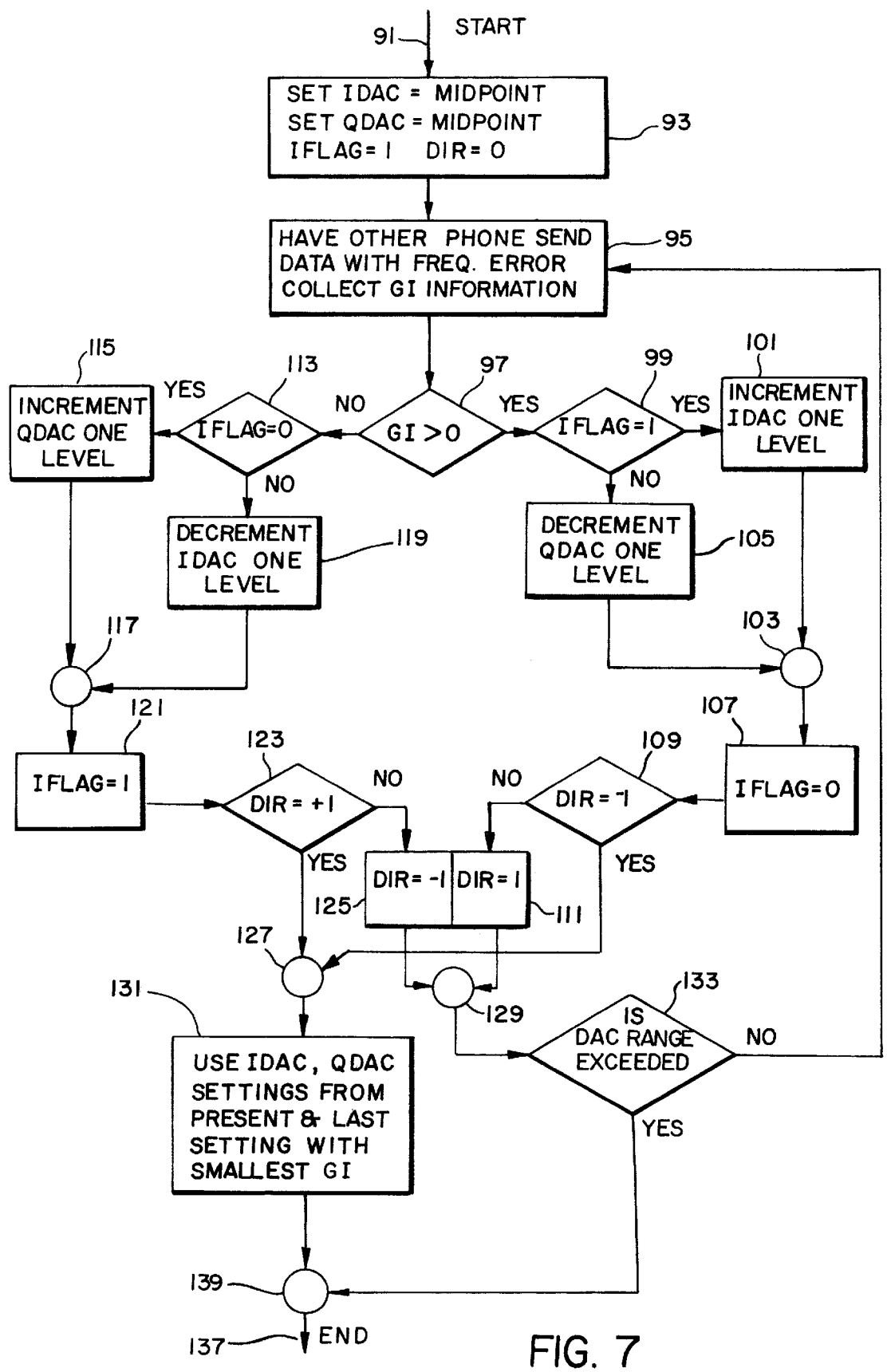
FIG. 7 is a flow chart of the controller sequence when operating the gain imbalance compensation circuit of FIGS. 4, 5, and 6.

The D/A converters are incremented or decremented by the controller as directed by the gain error measured in the accumulator 85 (FIG. 4) by the controller, to increase the gain error compensation until the desired gain error is read in the accumulator 88. The process by which the controller runs this measurement and calibration cycle is illustrated in FIG. 7.

The controller of the particular handset or base station which is going to initiate the gain error measuring and calibration sequence starts at 91 by setting the I channel D/A converter 46 and the Q channel D/A converter 48 to its midpoint as a first step 93. In the second step 95, the controller gets another handset or the base station to send data with a frequency error. This frequency error is collected in the accumulator 85 (FIG. 4). The controller reads the collected gain imbalance error and determines if it is greater than 0 at step 97. If the gain imbalance error is not 0, the controller determines if the in-phase flag is 0 at step 113. If it is not 0, the controller decrements the in-phase D/A converters 46 one level at step 119. If the in-phase flag is 0, the controller increments the quadrature phase D/A converter 48 one level at step 115. Either path leads to operator 117, which causes, at step 121, to have the controller set the in-phase flag to 1. The controller at that point checks to see if the DIR is 1 at step 123. If it is, the operator, at step 127, instructs the controller to use the in-phase D/A and quadrature D/A settings from the present and last setting. Once the D/A converter settings are established at 135, the gain imbalance error, measurement, and calibration process is over at 137.

If, at step 123, DIR was found not to equal 1, then the controller would direct, at step 125, to set the DIR to a −1, and then, through operator 129, inquire as to whether the D/A converter range has been exceeded at step 133. If it has been exceeded, then the measurement calibration sequence is over at 137. If it has not been exceeded, the controller has the other handset or base station again send data with a frequency error and collect the gain imbalance error in accumulator 85 (FIG. 4). The next step is to determine whether the gain imbalance error calculation is greater than 0 at step 97. If it is, the controller checks to see if the I flag is set at a 1 at step 99. If it is, the controller increments the in-phase D/A converter one level at step 101. If it is not, the controller decrements the quadrature phase D/A converter one level at step 105. Either path leads to the operator 103 that causes the in-phase flag to be set to zero at step 107. The controller then determines whether the DIR is set to a −1 at step 109. If the DIR is set to a −1, then operator 127 causes both the in-phase and quadrature phase D/A converter settings from the present and last setting to be used, thereby ending the measure and calibration sequence. If the DIR is not set to a −1 at step 109, the controller sets the DIR to +1 and, through operator 129, interrogates to see if the D/A controller's range has been exceeded. If it has, the measuring and calibration sequence is over at 137. If it has not been exceeded, the controller goes back to step 95 to again have the handset or the database send data with a frequency error and collect the gain imbalance information.

Those skilled in the art will appreciate that various adaptations and modifications of the just-described preferred embodiment can be configured without departing from the scope and spirit of the invention. Therefore, it is to be understood that, within the scope of the appended claims, the invention may be practiced other than as specifically described herein.

What is claimed is:

1. In a communication link having in-phase and quadrature baseband channels, a gain imbalance compensation circuit connected at a demodulation end of the link to balance the gain between the in-phase and quadrature baseband channels, the gain imbalance compensation circuit comprising:
   a circuit for introducing a frequency offset signal into the in-phase and quadrature channels at the demodulation end during a time no signals are being demodulated;
   a first digital circuit for detecting gain differences between the resulting signals in the in-phase and quadrature channels; and
   a second digital circuit for adjusting the gain in the in-phase or quadrature channel, as required, to bring the gain in both channels to about the same level.

2. The gain imbalance compensation circuit of claim 1 further comprising an accumulator to collect the gain differences for a certain time frame.

3. The gain imbalance compensation circuit of claim 1 wherein said second digital circuit comprises a first digital-to-analog converter associated with the in-phase signal path and a second digital-to-analog converter associated with the quadrature signal path.

4. The gain imbalance compensation circuit of claim 3 wherein said first digital-to-analog converter drives an analog-to-digital converter circuit for the in-phase signals and said second digital-to-analog converter drives an analog-to-digital converter circuit for the quadrature signals.

5. The gain imbalance compensation circuit of claim 4 wherein said first and second digital-to-analog converters are incremented or decremented in iteration steps until the gain difference between the in-phase and quadrature channel is the smallest.

6. The gain imbalance compensation circuit of claim 1 wherein said first digital circuit subtracts an absolute value of a resulting quadrature baseband digital signal from an in-phase baseband digital signal.

7. The gain imbalance compensation circuit of claim 6 further comprising an accumulator to collect the gain differences for a certain time frame.

8. The gain imbalance compensation circuit of claim 7 wherein said second digital circuit comprises a first digital-to-analog converter associated with the in-phase signal path and a second digital-to-analog converter associated with the quadrature signal path.

9. The gain imbalance compensation circuit of claim 8 wherein said first digital-to-analog converter drives an analog-to-digital converter circuit for the in-phase signals and said second digital-to-analog converter drives an analog-to-digital converter circuit for the quadrature signals.

10. In a cordless telephone having a base station connectable to a switched telephone network and at least one handset and at least one handset, said base station and handset communicating over a radio frequency link utilizing time division duplex direct sequence quadrature modulation, a gain imbalance compensation circuit in said handset and in said base station, each connected to receive the digital in-phase and quadrature baseband signals received over the radio frequency link, the gain imbalance compensation circuit comprising:

a circuit for introducing a frequency offset signal into the in-phase and quadrature signal channels during the time the handset is in the cradle of the base station;

a first digital circuit for detecting a gain imbalance between the resulting signals in the in-phase and quadrature channels; and a second digital circuit for increasing or decreasing the gain in the in-phase and quadrature signal channels until the gain in the in-phase and quadrature channels are in balance.

11. In a cordless telephone having a base station connectable to a switched telephone network and at least one handset, said base station and handset communicating over a radio frequency link utilizing time division duplex direct sequence quadrature modulation a gain imbalance compensation circuit in said handset and in said base station, each connected to receive the digital in-phase and quadrature baseband signals received over the radio frequency link, the gain imbalance compensation circuit comprising:

a circuit for introducing a frequency offset signal into the in-phase and quadrature signal channels during the time the handset is in the cradle of the base station;

a fist digital circuit for detecting a gain imbalance between the resulting signals in the in-phase and quadrature channels; and a second digital circuit for increasing or decreasing the gain in the in-phase and quadrature signal channels until the gain in the in-phase and quadrature channels are in balance.

12. The gain imbalance compensation circuit of claim 11 further comprising an accumulator to collect the gain differences for a certain time frame.

13. The gain imbalance compensation circuit of claim 11 wherein said second digital circuit comprises a first digital-to-analog converter associated with the in-phase signal path and a second digital-to-analog converter associated with the quadrature signal path.

14. The gain imbalance compensation circuit of claim 11 wherein said first digital-to-analog converter drives an analog-to-digital converter circuit for the in-phase signals and said second digital-to-analog converter drives an analog-to-digital converter circuit for the quadrature signals.

15. The gain imbalance compensation circuit of claim 14 wherein said first and second digital-to-analog converters are incremented or decremented in iteration steps until the gain difference between the in-phase and quadrature channels is the smallest.

16. The gain imbalance compensation circuit of claim 15 wherein said first digital circuit subtracts an absolute values of a resulting quadrature baseband digital signal from an in-phase baseband digital signal.

17. In a communication link having in-phase and quadrature baseband channels, a method for balancing the gain between the in-phase and quadrature baseband channels, the steps of the method comprising:

introducing a frequency offset signal into the in-phase and quadrature channel at the demodulation end during a time no signals are being demodulated;

detecting a gain difference between the resulting signals in the in-phase and quadature channels; and adjusting the gain in the in-phase or quadrature channel, as required, to bring the gain in both channels to about the same level.

18. The gain balancing method of claim 17 further comprising, after the detecting step, collecting the gain differences for a certain time frame.

19. The gain balancing method of claim 17 wherein said adjusting step comprises incrementing or decrementing the gain in either channel.

20. The gain balancing method of claim 17 wherein said detecting step comprises subtracting an absolute value of a resulting quadrature baseband signal from an in-phase baseband signal.

21. A system for balancing the gain between the in-phase and quadrature baseband channels, the system comprising:

means for introducing a frequency offset signal into the in-phase and quadrature channel at the demodulation end during a time no signals are being demodulated;

means for detecting a gain difference between the resulting signals in the in-phase and quadature channels; and means for adjusting the gain in the in-phase or quadrature channel, as required, to bring the gain in both channels to about the same level.

22. The gain balancing system of claim 21 further comprising means for collecting the gain differences for a certain time frame.

23. The gain balancing system of claim 21 wherein said means for adjusting comprises means for incrementing or decrementing the gain in either channel.

24. The gain balancing system of claim 21 wherein said means for detecting comprises means for subtracting an absolute value of a resulting quadrature baseband signal from an in-phase baseband signal.

* * * * *